United States Patent [19]

Crochet et al.

[11] Patent Number: 4,463,309
[45] Date of Patent: Jul. 31, 1984

[54] METHOD AND DEVICE FOR DETERMINING THE THRESHOLD OF RESISTANCE OF AN ELECTRIC OR ELECTROMAGNETIC EQUIPMENT TO AN EXTERNAL ELECTROMAGNETIC AGGRESSION

[75] Inventors: Michel H. Crochet, Verneuil; Jean-Claude L. Riaudet, Mantes-la-Jolie, both of France

[73] Assignee: Societe Nationale Industrielle et Aerospatiale, Paris, France

[21] Appl. No.: 422,725

[22] Filed: Sep. 24, 1982

[30] Foreign Application Priority Data

Sep. 29, 1981 [FR] France .................... 81 18306

[51] Int. Cl.$^3$ .................................. G01R 27/00
[52] U.S. Cl. ................................... 324/57 R
[58] Field of Search ............. 324/62, 57 R, 58 R; 333/12; 307/89, 90, 91

[56] References Cited

U.S. PATENT DOCUMENTS 3,952,245  4/1976  Miller ......................... 324/57 R

FOREIGN PATENT DOCUMENTS 54940  6/1982  European Pat. Off. .......... 324/57 R

OTHER PUBLICATIONS

Burns: "Rejection of R-F Noise . . . "-IEEE Trans. on Nuclear Science-vol. 23, No. 1, pp. 375-382, Feb. 1976.

Primary Examiner—Stanley T. Krawczewicz
Assistant Examiner—Jose M. Solis
Attorney, Agent, or Firm—Marshall, O'Toole, Gerstein, Murray & Bicknell

[57] ABSTRACT

Method and device to determine the threshold of resistance of an electric or electronic equipment to an external electromagnetic aggression, by simulating such aggression, the said equipment comprising at least two units joined together by way of a connection comprising shielded conductors.

The invention is remarkable in that at least one passive injection element is inserted in the said connection, which element presents a known transfer impedance and comprises an external casing, inner conductors, and end connectors, so that said injection element ensures a continuity of the normal electric connections between the said units and that its external casing is electrically connected to the shielding of the said connection, in that the said equipment equipped with its injection element is subjected to the action of an electromagnetic testing field.

4 Claims, 4 Drawing Figures

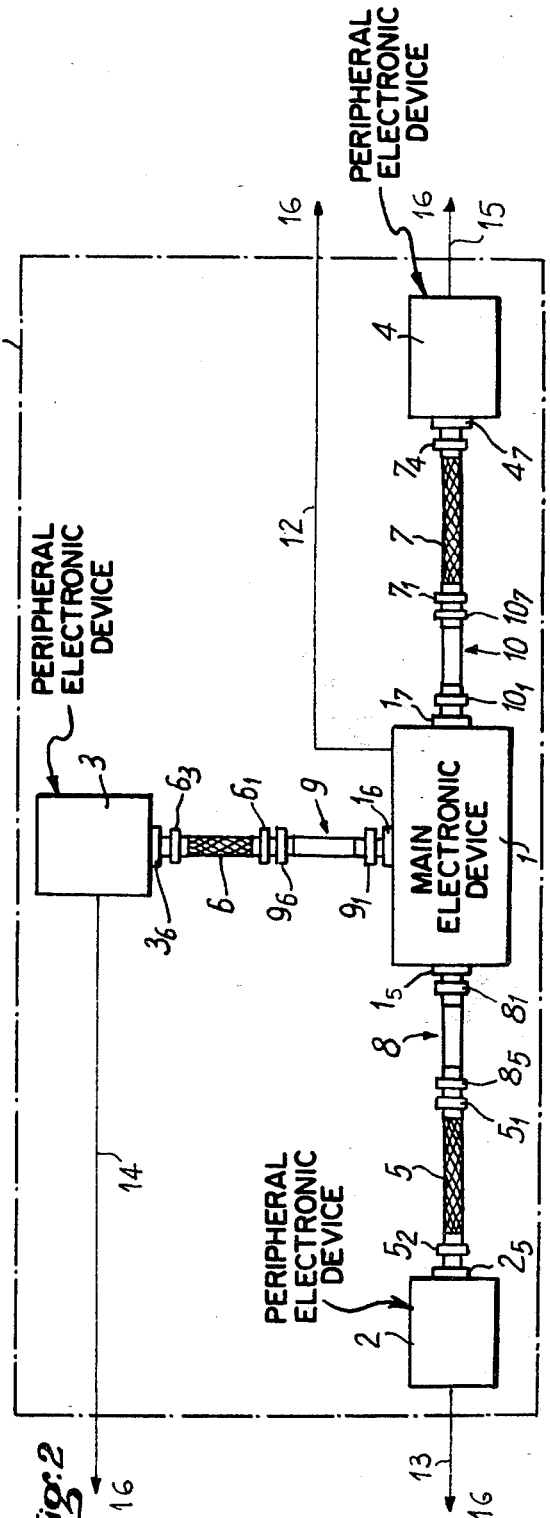

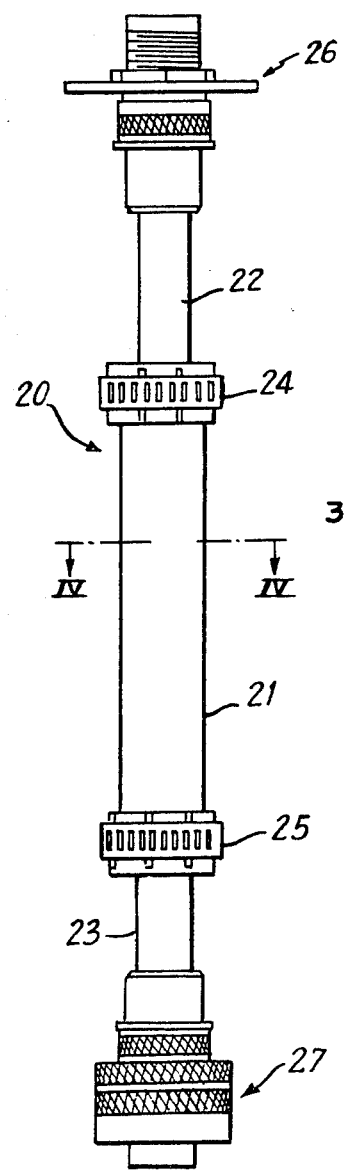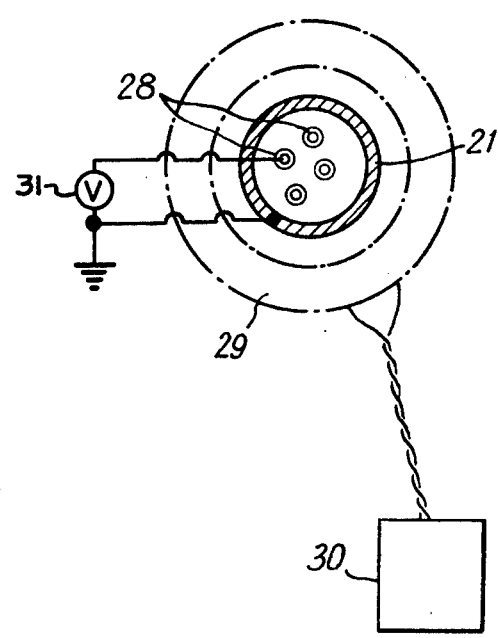

METHOD AND DEVICE FOR DETERMINING THE THRESHOLD OF RESISTANCE OF AN ELECTRIC OR ELECTROMAGNETIC EQUIPMENT TO AN EXTERNAL ELECTROMAGNETIC AGGRESSION

The present invention relates to a method to determine the threshold of resistance of an electronic or electric equipment to an external electromagnetic aggression, and to devices for carrying out said method.

It is a known fact that in many fixed or movable modern technical installations, electric or electronic equipments are used which are sensitive to electromagnetic disturbances. In the case of a nuclear explosion, a very strong electromagnetic pulse would be generated, which could affect the said equipments, even making them inoperative. Indeed, such an electromagnetic pulse travels like a plane wave carrying a certain energy; before it reaches the vulnerable equipment, part of this energy can be absorbed or reflected by suitable shields or screens, such as for example structural screens, interposed on its path, with the effect of reducing the amplitude of the electromagnetic field which reaches the equipments. Nonetheless, a certain amount of energy remains available on the level of the connection wire system and of the equipments and by direct (radiation) or indirect (currents conducted and channelled by the structure of the installations) coupling, currents, which may be strong currents, can flow over the shielding of the wiring connecting the equipments together, thus generating on certain inputs of the equipments, interfering stray voltages, which could be dangerous for their operation.

When manufacturing the equipment, it is possible to determine easily, either through theoretical analysis of the circuits, or through experience, the acceptable electromagnetic interfering levels on the inputs of the said equipments.

On the contrary, when these equipments are being integrated and interconnected, it becomes essential to check experimentally the good operation of the entire assembly, both in a normal environment, also called "safe" environment, and in a disturbed environment.

The object of the tests conducted in a safe environment being to control the good operation of the assembly, that of the tests conducted in a perturbed environment is to ensure that no function is affected when the assembly is deliberately exposed to a simulated electromagnetic aggression.

Generally speaking, everything having been done, construction-and connection-wise, so that the equipment can withstand a given electromagnetic aggression, the tests conducted in a disturbed environment confirm that all the equipments and their peripherals operate correctly, even in conditions of aggression.

It is however advantageous to find out the margin of good operation, all the more so that the environment of the equipments under control (vibrations, warming-up, corrosion, . . . ) can cause temporary or permanent failures of the equipment.

It is therefore essential to check, in actual conditions of use (equipments connected together and communicating through their interconnecting wiring system) where the threshold of inaccurate operation is situated, when concentrated and quantized degradations of the connections make it possible to apply on the inputs of the equipments, known levels of disturbance.

Methods are already known for testing the resistance of electrical or electronic equipment to an aggression by applying stray voltages in predetermined parts thereof. None of these known methods however permits to apply predetermined voltages to the input of an equipment:

(a) without disconnecting it from its peripheral
(b) superimposed over its functional signals,
(c) in a disturbed electromagnetic environment, such as that of a nuclear explosion.

At best, these known methods only permit, to meet two of the three aforesaid conditions (a), (b) and (c).

For example, injection circuits are already known which connect up to the input of an electric or electronic device and permit to inject known interferences. Such injection circuits enable to determine the margin of operation of the device under test, but on the other hand, they require that said device be disconnected from its peripherals, since the said circuits take the place of the latter.

Then, only the device can be tested separately and not the whole equipment assembly.

In a variant, at least one injection circuit and one measuring circuit are inserted in the connections between the devices of the equipment, in order not to break the said connections. Such a method is extremely limited in its conditions of utilization, since it presupposes that the signal measured by the measuring circuit has the same characteristics as the real signal at the input of the equipment, which is untrue. Indeed, the fact of joining the injection and measuring circuits to the equipment introduces stray capacitances which alter the accurate determination of the threshold of good operation.

It has also been proposed to subject the equipment assembly to direct radiation, by way of an electromagnetic generator. But, with this type of method, it is impossible to determine experimentally the threshold of good operation, due to the fact that the level of radiation needed would demand a range impossible to obtain with the currently known generators. In addition, said method does not permit to determine the value of the level of interference at the input of the equipment which has caused the failure.

It is the object of the present invention to overcome these drawbacks by permitting to determine, simply and significantly, the threshold and margin of good operation, by inserting interferences and without having to measure the injected stray voltage. Moreover, the present invention meets the three conditions (a), (b) and (c) mentioned hereinabove.

To this end, the method according to the invention for determining the threshold of resistance of an electric or electronic equipment to an external electromagnetic aggression, which equipment comprises at least two units joined together by way of a connection comprising shielded conductors, is remarkable in that at least one passive injection element is inserted in the said connection, which element presents a known transfer impedance and comprises an external casing, inner conductors and end connectors, so that said injection element ensures a continuity of the normal electric connections between the said units and that its external casing is electrically connected to the shielding of the said connection, in that the said equipment equipped with its injection element is subjected to the action of an electromagnetic testing field, in that said element and/or said field is acted upon to disturb the operation of the said equipment and in that the said threshold is determined from the transfer impedance of the said injection element when a first disturbance occurs in the operation of the equipment. As used herein, the term "injection element" refers to an element which introduces or injects a parasitic signal into a circuit in which it is incorporated. A "passive" injection element is one which does not have its own energy source; rather, the signal it injects is induced by the action of an external electromagnetic field to which the element is exposed.

Thus, the "threshold of resistance to an external electromagnetic aggression" corresponds to a value of the amplitude of the electromagnetic aggression below which the said equipment continues to work normally and above which the operation of said equipment is disturbed and may be impaired.

It is also known that the transfer impedance of an element is the ratio ZT of the voltage which appears, under the action of the external electromagnetic field, between conductors joined at the two ends of the casing, and of the current running through the said casing. One great advantage of the present invention resides in the fact that no voltage measurement is necessary inside the casing since the current running through the casing can easily be measured from the outside by way of a ferromagnetic torus system for example.

According to the present invention, it is possible to insert a passive injection element of known transfer impedance in the connection and to vary the external electromagnetic field; it is even possible to insert successive injection elements of increasing transfer impedance and to simultaneously vary the electromagnetic field. However, as mentioned hereinabove, the currently known generators of electromagnetic field do not have a very high range. Therefore, and despite the fact that the insertion of an element according to the invention permits to reduce the range required for the generator, according to the preferred embodiment of the invention, the amplitude of the electromagnetic testing field is kept constant and injection elements of increasing transfer impedance are successively inserted in said connection, the transfer impedance of at least the first element inserted being, a priori, so selected that the voltage generated inside the casing by the electromagnetic testing field has no action on the operation of the equipment, note is made of the transfer impedance of the last injection element at which the operation of the equipment is not disturbed, and/or of the transfer impedance of the first injection element at which the operation of the equipment starts to become disturbed, and from the transfer impedance of one of these elements is determined the threshold.

This method of carrying out the invention is based on the fact that to increase successively the transfer impedance of the coaxial elements is equivalent to increasing the amplitude of the electromagnetic field. Indeed, for a field of amplitude R (in kV/m for example) the screening is run through by a current I which is a function of R, so that a voltage $V=ZT\times I$ appears inside the screening. An increase $\Delta R$ in the amplitude of field R would entail an increase $\Delta I$ of the current I and an increase $\Delta V$ of the voltage V, and $$(\Delta R/R)=(\Delta I/I)=(\Delta V/V)$$

could be written.

Now, if R is kept constant, so is I and voltage V takes on the value $V=ZT\times I$. If the transfer impedance ZT is increased by the quantity $\Delta ZT$, the voltage V increases by $\Delta V=\Delta ZT\times I$. As a result, the ratio ($\Delta ZT/ZT$) is equal to ($\Delta V/V$). The variation of transfer impedance is therefore equivalent to a variation of electromagnetic field and the margin of good operation, which should be measured by ($\Delta R/R$), can then be represented by ($\Delta V/V$).

According to the preferred embodiment of the invention, the electromagnetic field is kept constant at the value R and transfer impedance elements ZT1, ZT2, ZT3, ... ZTn1, ZTn, ZTn+1 increasing, are inserted. Impedance elements ZT1, ZT2 ... ZTn do not disturb the operation of the equipment. On the contrary, when the impedance element ZTn+1 is in place, the operation is disturbed. In addition, in the absence of the said co-axial elements, the connection into which they are inserted has its own transfer impedance ZTo, with $$ZTo<ZT1<ZT2<\ldots<ZTn-1<ZTn<ZTn+1$$

As a result, the margin of good operation is determined by $$\frac{\Delta V}{V} = \frac{\Delta ZT}{ZTo} = \frac{ZTn - ZTo}{ZTo}$$

Due to the fact that $\Delta R/R=\Delta V/V$, it is possible to work out $\Delta R$, which is equal to $$\Delta R = \frac{ZTn - ZTo}{ZTo} \times R$$

As a result, the threshold of good operation is $$R + \Delta R = R\left[1 + \frac{ZTn - ZTo}{ZTo}\right], \text{ i.e.}$$

$$R + \Delta R = R\frac{ZTn}{ZTo}$$

In order to find out V, $\Delta V$ and $V+\Delta V$, it suffices to measure the currents I and $I+\Delta I$ respectively running through the shielding of the connection, as well as those of the connection and co-axial element, using a torus type device or the like.

A co-axial element to carry out the method according to the invention comprises a tubular casing providing shielding and enclosing the conductors used to ensure the electric connections, as well as connectors to which the said conductors are connected, the said connectors being provided with connection means such as threaded collars or nuts, insulated from the said conductors, but in electrical contact with said tubular casing.

Said tubular casing can for example be constituted by a section of tube in resistant and conducting material, a helical coil of wire, a braided metallic sleeve, etc. ...

In order to carry out the method according to the invention, there is provided a set comprising a plurality of such elements, calibrated according to their transfer impedance. Such calibrating can be obtained by subjecting the elements to a known electromagnetic field and by measuring the current running through their casing.

It is thus obvious that the present invention enables to work out a margin of good operation or to find out the weak point in a chain of equipments, when all these equipment communicate together. This margin occurs therefore at the final level of an integration by permitting through local injection of an external voltage or through radiation over the whole assembly, to qualify an entire chain, to detect its weak points and to locate the threshold at which the first faults appear.

The invention will be more readily understood on reading the following description with reference to the accompanying drawings in which:

FIG. 1 shows by way of example and non-restrictively a block diagram of an electronic equipment;

FIG. 2 illustrates the application of the method according to the invention to the equipment shown in FIG. 1;

FIG. 3 is an elevational view of a device for carrying out the method according to the invention;

FIG. 4 is a cross-section along line IV—IV of FIG. 3.

Referring first to FIG. 1, this shows an arbitrary example of electronic equipment comprising a main device 1 and three peripheral devices 2, 3 and 4. The peripheral devices 2,3 and 4 are connected to the main device 1 via interconnecting cables 5,6 and 7. To this effect, the devices 1 to 4 are respectively provided with connectors $1_5$, $1_6$, $1_7$, $2_5$, $3_6$ and $4_7$, respectively provided to cooperate with the complementary connectors $5_1$, $6_1$, $7_1$, $5_2$, $6_3$ and $7_4$ of cables 5,6 and 7.

In FIGS. 1 and 2, each of the connectors bears the reference of the device 1 to 4 or of the cable 5 to 7 to which it is joined, completed with an index number corresponding to the reference of the device 1 to 4 or to that of the cable 5 to 7 to which it is designed to be joined.

Thus the devices 1 to 4 are interconnected and dialog together. Their design, as well as the connections made by the cables 5,6 and 7 are such that the assembly 1 to 7 is able to operate normally when said assembly is subjected to the field of a standardized electromagnetic radiation R (expressed for example in kV/m and simulating a nuclear explosion).

The problem which is solved by the invention is that of determining the threshold of good operation, namely, and assuming that the radiated power to which the assembly 1 to 7 is subjected, could be increased, determining the field $R + \Delta R$ from which faults first appear in the operation.

Since it is difficult or impossible, technically, to vary or to increase the field R to which the assembly 1 to 7 can be subjected, the method according to the invention is preferably carried out as illustrated in FIG. 2.

According to said method, injection elements 8, 9 and 10 are inserted in at least some of the connections between the device 1 and the devices 2,3 and 4, each injection element having a known transfer impedance and permitting a continuity of normally operating connections between these devices. A plurality of elements 8, 9 and 10 is thus obtained (shown with the general reference 20 in FIGS. 3 and 4) which are calibrated in transfer impedance.

The assembly 1 to 4 is then placed inside an enclosure or space 11 inside which or wherefrom the electromagnetic field R can be generated. Then elements 8, 9 and 10 are inserted in cables 5, 6, and 7, respectively. Said elements are provided to this effect with connectors $8_1$, $9_1$, $10_1$, adapted to cooperate with the connectors $1_5$, $1_6$ and $1_7$, and with connectors $8_5$, $9_6$ and $10_7$, adapted to cooperate with connectors $5_1$, $6_1$ and $7_1$. The assembly 1 to 10 is then subjected to the field R and, owing to the connections 12 to 15 and to a control device 16 (not shown and external to enclosure 11), the operation of assembly 1 to 10 can be checked. For simplification purposes, it is assumed that the transfer impedance of elements 8, 9 and 10 is the same and equal to ZT1 during the first test. If the control device 16 indicates that, in these conditions, the device 1 to 7 works correctly, elements 8, 9 and 10 are replaced by others, having a transfer impedance equal to ZT2, with ZT2>ZT1. And so on, until the control device 16 indicates the first failure of equipment 1 to 7.

The foregoing calculations enable to obtain the threshold of good operation.

The structure of one embodiment 20 of the elements 8,9 and 10 is illustrated by FIGS. 3 and 4. These elements being inserted in the normal connections between the main device 1 and the peripheral devices 2,3 and 4, it is necessary for the connectors $8_1$, $9_1$ and $10_1$ to be similar to the connectors $5_1$, $6_1$ and $7_1$ respectively, whereas the connectors $8_5$, $9_6$ and $10_7$ should be similar to connectors $1_5$, $1_6$ and $1_7$ respectively. In the embodiment 20, the connectors $8_1$, $9_1$ and $10_1$ are represented by a multipin connector plug 26, whereas the connectors 8, 9 and 10 are represented by a mobile connector 27. Moreover, the element 20 has to ensure the transmission of the information between each pin of the connector ($1_5$, $1_6$, or $1_7$) of equipment 1 and each pin of the connector ($5_1$, $6_1$ or $7_1$) of the cable 5, 6 or 7. There is as a result an end-and-end wiring between the connectors 26 and 27, due to a plurality of conductors 28.

The element 20 comprises a hollow central part 21, inside which pass the conductors 28, and of which the physical and electrical characteristics (conductivity, transfer impedance, dimensions, etc . . . ) are selected in relation to the characteristics of the equipment 1,2,3 and 4.

The connectors 26 and 27 are connected to the hollow central part 21 by two metallic adapting parts 22 and 23 respectively, ensuring the electrical contact. Said adapting parts 22 and 23 are secured to the central part 21 by way of clamping means 24 and 25, respectively. Said adapting parts could also be secured by welding. Likewise, the connectors 26 and 27 are secured to the adapting parts 22 and 23 by welding, or optionally by screwing.

The electrical characterstics required for each element 20 are obtained by adequately selecting the central part 21. This can be, amongst other things:

(a) a resistant tube, for example containing carbon, with no self-inductance. Due to the very average conductivity of carbon, it is easy to obtain relatively high resistance values (between $1\Omega$ and $5000\Omega$) whilst keeping the element 20 to reasonable dimensions. Also in this case, the impedance being merely resistive, the induced voltage V inside the tubular resistor is determined simply, by applying Ohm's law, generalized:

$V = ZT \times I$, I being the current running over the outside part of the tubular resistor under the action of the field R.

(b) a metallic tube, in copper for example, provided with a plurality of holes along the generating lines of the tube. The diameter, diameters, and/or the number of holes enable to adjust the transfer impedance, from 10 to 100 m$\Omega$ for example.

(c) a helical coil of resistant wire. Such a coil makes it easy to cover a range of impedances varying between 100 m$\Omega$ and 10$\Omega$. This impedance cannot be constant related to the frequency, so that the determination of induced voltage V requires mathematical calculations, based on the Fourier transform technique for example.

(d) a braided metallic shield, in tin-plated copper for example. In this case, the gaps between the strands of the braid also have the effect that the transfer of impedance is not constant in relation to the frequency. With such a shield, it is possible to obtain an impedance range of between 1 mΩ and 1Ω.

In particular, when the impedance of the central part 21 is simply resistive, it is easy to measure it and therefore to calibrate the corresponding element 20. To this effect, and as illustrated in FIG. 4, it suffices when the element 20 is subjected to a field R (for example inside the enclosure 11) to measure (i) the current I which circulates in the central part 21, using an ammeter-type measuring apparatus with a torus 29 surrounding the central part and an ammeter 30 and (ii) the voltage V between a conductor 28 and the earth (using a voltmeter 31). The impedance ZT is then obtained by working out the ratio (V/I). Said impedance ZT being known, it is easy to work out (when using the method according to the invention such as illustrated in FIG. 2), the voltage V induced inside the central part 21. It suffices to measure the current I with the apparatus 29, 30. The voltage V is deduced from the measurement of I and the value of ZT, by the relation $V = ZT \times I$.

What is claimed is:

1. A method for determining the threshold of resistance to disturbance by an external electromagnetic field, of an electric or electronic apparatus comprising at least two units interconnected by electrical connection means comprising an external shield and at least one inner conductor, said method comprising the steps of:

inserting into said connection means a passive injection element having a known relatively low transfer impedance, said element comprising an external casing electrically connected at its ends to the external shield of said connection means, and at least one inner conductor forming a conductive path with each corresponding conductor in said connection means;

operating said apparatus in the presence of an electromagnetic testing field of known intensity sufficiently low to cause no disturbance in the operation of said apparatus;

increasing the magnitude of at least one of said transfer impedance and said field intensity by known increments until a disturbance in the operation of said equipment is observed; and determining said threshold from the magnitudes of said transfer impedence and said field intensity when said disturbance is first detected.

2. A method as claimed in claim 1 wherein the intensity of the electromagnetic testing field is kept constant and injection elements of increasing transfer impedance are successively inserted in said connection, said threshold being determined from the transfer impedence of the element having the largest value of transfer impedence which does not disturb the operation of the equipment or from the transfer impedence of the element having the smallest value of transfer impedence which causes a disturbance in the operation of the equipment.

3. Method as claimed in claim 1, wherein an injection element of known transfer impedance is inserted in the connection and the external electromagnetic field is caused to vary.

4. Method as claimed in claim 1, wherein successive injection elements of increasing transfer impedance are inserted and the electromagnetic field is caused to vary simultaneously.

* * * * *